(12) United States Patent
Kubota

(10) Patent No.: US 6,261,047 B1
(45) Date of Patent: Jul. 17, 2001

(54) ELECTRONIC COMPONENT FEEDER

(75) Inventor: Shuuichi Kubota, Yamanokami (JP)

(73) Assignee: Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/367,218

(22) PCT Filed: Feb. 19, 1998

(86) PCT No.: PCT/JP98/00682

§ 371 Date: Aug. 11, 1999

§ 102(e) Date: Aug. 11, 1999

(87) PCT Pub. No.: WO98/37746

PCT Pub. Date: Aug. 27, 1998

(30) Foreign Application Priority Data

Feb. 20, 1997 (JP) .................................................... 9-035417

(51) Int. Cl.⁷ .................................................... H05K 13/04
(52) U.S. Cl. .................................................... 414/411; 156/584
(58) Field of Search ............................. 414/411; 156/584

(56) References Cited

U.S. PATENT DOCUMENTS

| | | | |
|---|---|---|---|
| 4,586,670 | * 5/1986 | Vancelette et al. | ............ 156/584 |
| 5,310,301 | * 5/1994 | Aono | .................. 414/411 X |
| 5,342,474 | * 8/1994 | Mohara et al. | ............ 156/584 |
| 5,531,859 | * 7/1996 | Lee et al. | .................. 156/584 |
| 5,759,344 | * 6/1998 | Yasunaga et al. | ............ 156/584 |

FOREIGN PATENT DOCUMENTS

| | | |
|---|---|---|
| 4-171893 | 6/1992 | (JP) . |
| 9-36589 | 2/1997 | (JP) . |

* cited by examiner

Primary Examiner—Steven A. Bratlie
(74) Attorney, Agent, or Firm—Parkhurst & Wendel, L.L.P.

(57) ABSTRACT

An electronic component feeder capable of stably feeding electronic components in a process for transferring a tape accommodating the electronic components, peeling off a top tape and extracting the electronic components. The feeder includes a peel portion for peeling off a top tape and for contacting a tape transfer surface through a carrier tape, a window portion for extracting the electronic components, a tape press body slidably supported in a pressing direction of the carrier tape on the tape transfer surface, and an urging member for urging the tape press body against the tape transfer surface.

4 Claims, 9 Drawing Sheets

ELECTRONIC COMPONENT FEEDER

TECHNICAL FIELD

The present invention relates to an electronic component feeder capable of extracting electronic components accommodated in a container while peeling a top tape of a carrier tape.

BACKGROUND ART

FIGS. 6 to 9 show a conventional electronic component feeder.

As shown in FIG. 6, an electronic component 3 is accommodated in a container 2 in a carrier tape 1, and the surface of the carrier tape 1 is covered with a peelable top tape 4 in order to prevent the electronic component 3 from falling off.

The carrier tape 1 containing the electronic component 3 therein is fed from a carrier tape feeding-out reel 6 disposed at the base end of an electronic component feeder 5 to a tape feeding wheel 8 by means of a feed lever 7, as shown in FIGS. 7 and 8. At the tip end of the electronic component feeder 5, the carrier tape 1 is transferred while being pressed against a tape transfer surface 12 by means of a tape press body 9.

While the top tape 4 of the carrier tape 1, transferred at a predetermined pitch by means of the tape feeding wheel 8, is peeled at a peeling portion 13 formed at the tape press body 9, the electronic component 3 is extracted through a window portion 14 formed downstream of the tape press body 9 by means of a suction nozzle 10. The peeled top tape 4 is taken up around a taking-up reel 11.

The base end (upstream end) of the tape press body 9 is pivotally supported by a main block 17 centering on a shaft 15 (i.e., in a direction indicated by an arrow A), as specifically shown in FIG. 8, and the tape press body 9 is urged in such a direction as to be pressed against the tape transfer surface 12 by a spring 16.

With the conventional configuration as described above, since a clearance between the tape transfer surface 12 and the tape press body 9 becomes large in the vicinity of the peeling portion 13 upstream in a tape transfer direction (i.e., in a direction indicated by an arrow B), in the case where the thickness of the carrier tape 1 is thin, as shown in FIG. 9(a), there arises a problem that the electronic component 3 accommodated in the container 2 is rotated under wind pressure induced by the movement of the top tape 4 in the peeling portion 13.

Furthermore, since the clearance between the tape transfer surface 12 and the tape press body 9 becomes large in the vicinity of the window portion 14 downstream in the tape transfer direction (i.e., in the direction indicated by an arrow B), in the case where the thickness of the carrier tape 1 is thick, as shown in FIG. 9(b), there arises another problem that the electronic component 3 cannot be normally extracted due to the vibration of the electronic component 3 based on a pulsation in the feeding direction of the carrier tape 1.

Moreover, if the urging force of the spring 16 is so strong as to deform the tape press body 9 to eliminate the clearance between the carrier tape 1 and the tape press body 9, there arises a further problem that the carrier tape 1 is deficiently transferred due to excessive pressing of the carrier tape 1.

The present invention has been accomplished to solve the above problems of the prior art. Therefore, on object of the present invention is to provide an electronic component feeder capable of stably feeding electronic components in the processes of transferring a tape accommodating the electronic components therein, and peeling a top tape so as to extract the electronic components.

DISCLOSURE OF THE INVENTION

An electronic component feeder according to the present invention is configured such that a tape press body for pressing a carrier tape in order to stably supply electronic components is slidably supported in a direction in which the carrier tape is pressed against a tape transfer surface according to the thickness of the carrier tape to be transferred.

According to the present invention, it is possible to provide the electronic component feeder capable of stably feeding the electronic components in the process of transferring the tape accommodating the electronic component therein, and peeling a top tape so as to extract the electronic component.

In an electronic component feeder according to a first aspect of the invention, which can take electronic components out of a container while peeling a peelable top tape in the process of transferring, along a tape transfer surface, a carrier tape accommodating the electronic components in the container and being covered with the top tape, the electronic component feeder, includes a tape press body abuttable against the tape transfer surface via the carrier tape and including a peeling portion for peeling the top tape and a window portion for taking out the electronic components therethrough, and being slidably supported in a direction in which the carrier tape is pressed against the tape transfer surface; and an urging member for urging the tape press body against the tape transfer surface.

With this configuration, the tape press body slides with respect to the tape transfer surface according to the thickness of the carrier tape to be transferred, so that a clearance between the tape transfer surface and the tape press body can be kept constant over a long section, thereby eliminating any rotation of the electronic components at the time of peeling the top tape or any vibration of the electronic component at the time of extracting the electronic component. As a result, a supplying rate of the electronic components can be increased.

According to a second aspect of the invention a first end of the tape press body on an inlet side of the carrier tape is slidably supported in the direction in which the carrier tape is pressed against the tape transfer surface; a second end of the tape press body on an outlet side of the carrier tape engages with a pivotably supported turning body; and the urging means comprises a first spring for urging the end of the tape press body on the inlet side of the carrier tape toward the tape transfer surface, and a second spring for urging the turning body in the direction in which the tape press body is pressed against the tape transfer surface.

With this configuration, the tape press body slides in the direction in which the carrier tape is pressed against the tape transfer surface by means of the first and second springs.

According to a third aspect of the invention, the first spring is interposed between the upper surface of the tape press body (9) and a projecting tip (29) of a bracket (25) fixed at the side surface of the tape transfer surface (12), in the vicinity of the peeling portion of the carrier tape.

According to a fourth apsect of the invention, the turning body is disposed in such a manner as to be engaged with a projection projecting outward of the tape transfer surface at a part of the tape press body.

BEST MODE FOR CARRYING OUT THE INVENTION

Figure 1:
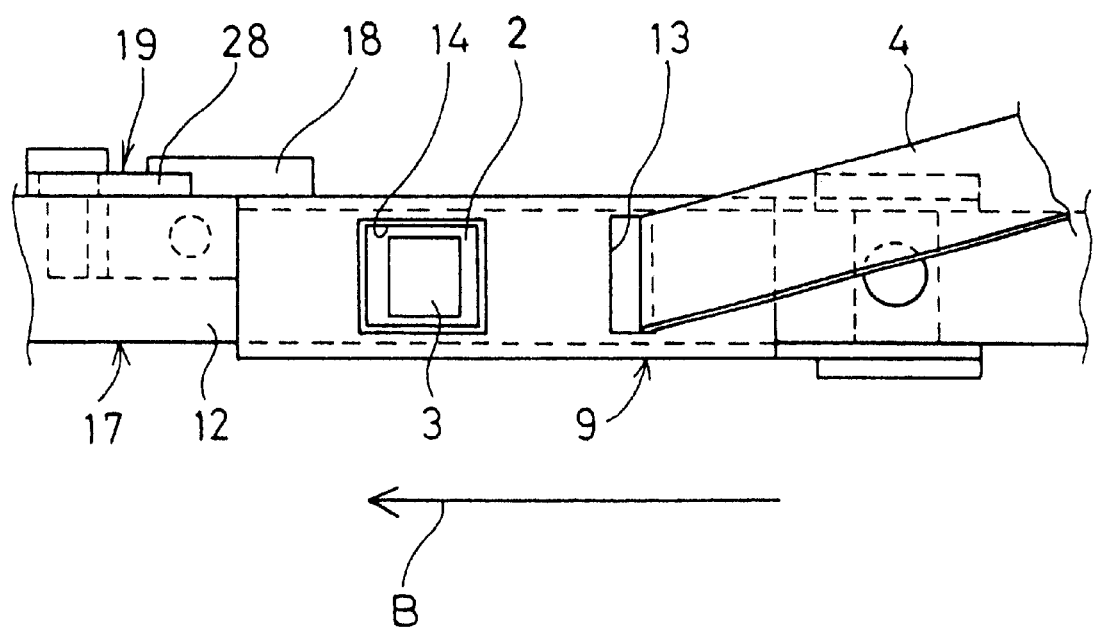
FIG. 1 is a plan view showing an electronic component feeder of a first embodiment.

Preferred embodiments according to the present invention will be described hereinafter with reference to FIGS. 1 to 5.

Parts similar to those previously described with reference to FIGS. 6 to 9 showing the prior art are denoted by the same reference numerals.

First Embodiment

Figure 2:
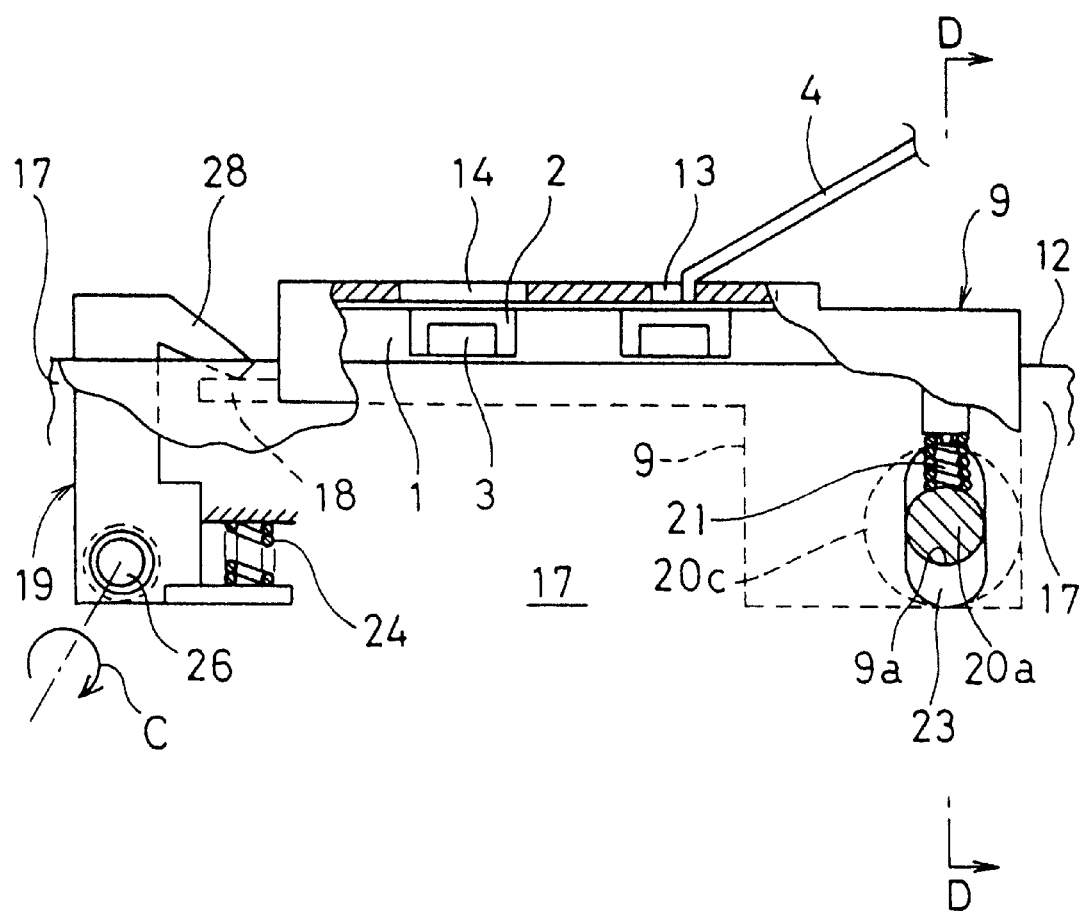
FIG. 2 is a cross-sectional view showing the essential parts of the electronic component feeder of the first embodiment.

FIGS. 1 to 3 show a first embodiment according to the present invention.

As shown in FIGS. 1 and 2, a band-like carrier tape 1, which accommodates an electronic component 3 in a container 2 and is covered at the surface thereof with a peelable top tape 4, is fed on a tape transfer surface 12 along a tape transfer direction (i.e., a direction indicated by an arrow B). In order to stably transfer the carrier tape 1, the carrier tape 1 is pressed on the tape transfer surface 12 by a tape press body 9 formed into an inverted-U shape (i.e., the tape press body 9 is bent downward at both lateral ends).

While the top tape 4 of the carrier tape 1 fed is peeled at a peeling portion 13 formed at the tape press body 9, the electronic component 3 is extracted from the carrier tape 1 through a window portion 14 by a suction nozzle.

The base end of the tape press body 9 is slidably supported in a direction in which the carrier tape 1 is pressed against the tape transfer surface 12. There is provided urging means for urging the tape press body 9 toward the tape transfer surface 12.

Figure 3A:
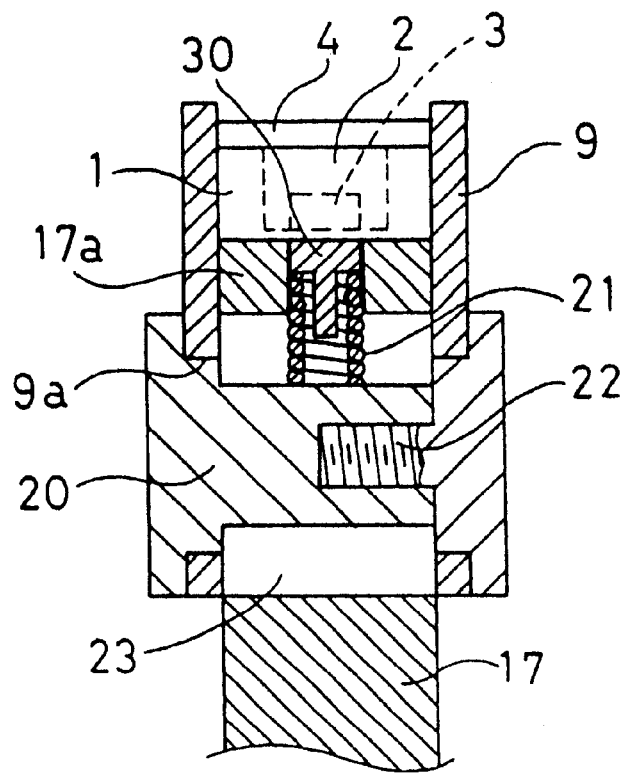
FIGS. 3(a) and 3(b) are cross-sectional views showing the essential parts of the electronic component feeder shown in FIG. 3 and a cross-sectional view taken along line D—D in FIG. 2, respectively.
Figure 3B:
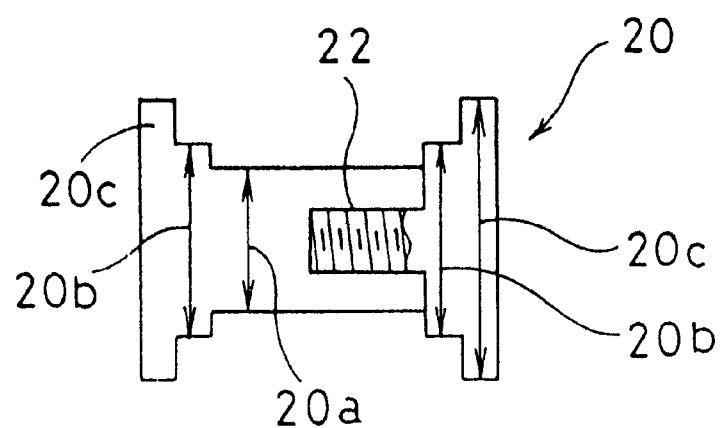

Namely, as shown in FIGS. 2, 3(a) and 3(b), a slot 23 is bored at a main block 17 on a stationary side where the tape transfer surface 12 is formed. The base end of the tape press body 9 is set in such a manner as to hold the main block 17 between both side surfaces thereof, and further, a circular hole 9a is formed at a position corresponding to the slot 23, for allowing a large-diameter portion 20b of a pin 20 to be inserted therethrough.

The pin 20 includes a small-diameter portion 20a to be inserted into the slot 23, flanges 20c disposed at both ends of the small-diameter portion 20a, and the large-diameter portions 20b formed between the small-diameter portion 20a and the flanges 20c. The diameter of the flange 20c is greater than that of the large-diameter portion 20b, and substantially the same as the long axis of the slot 23. The pin 20 in this embodiment is configured such that one large-diameter portion 20b and the flange 20c positioned at an end of the small-diameter portion 20a are screwed at the tip of the small-diameter portion 20a via a screw 22.

In this manner, the small-diameter portion 20a of the pin 20 set in the circular hole 9a of the tape press body 9 is inserted into the slot 23 of the main block 17 so that the tape press body 9 can be slidably supported in the direction of the long axis of the slot 23. A first compression spring 21 serving as a first spring for urging the pin 20 downwardly is interposed between a pressing pin 30 screwed at the upper end 17a of the inner circumference of the slot 23 and the small-diameter portion 20a of the pin 20.

As shown in FIG. 1, a projection 18 is formed at the front end of the tape press body 9 in such a manner as to project outwardly of the tape transfer surface 12. A turning body 19 turnable around the axis of a shaft 26 (i.e., in a direction indicated by an arrow C) is disposed in the main block 17 on the stationary side corresponding to the projection 18 of the tape press body 9. The front end 28 of the turning body 19 is engaged with the upper surface of the projection 18 of the tape press body 9. The turning body 19 is adapted to press the carrier tape 1 on the tape transfer surface 12 by means of a second compression spring 24 serving as a second spring.

In this manner, the tape press body 9 urged at the base end and front end thereof by the first and second compression springs 21 and 24, is slidably moves in a direction approaching or separating from the tape transfer surface 12 according to the thickness of the carrier tape 1 interposed between the tape press body 9 and the tape transfer surface 12, so that the clearance between the tape transfer surface 12 and the tape press body 9 can be uniformly kept constant over a long section.

Consequently, the tape press body 9 can be uniformly pressed against the tape transfer surface 12 over the long section even if the thickness of the carrier tape 1 is varied. Thus, it is possible to prevent any rotation of the electronic component 3 at the time of the peeling of the top tape 4 or any vibration of the electronic component 3 at the time of the extraction of the electronic component, 3 so that the electronic component can be stably supplied.

Second Embodiment

Figure 4:
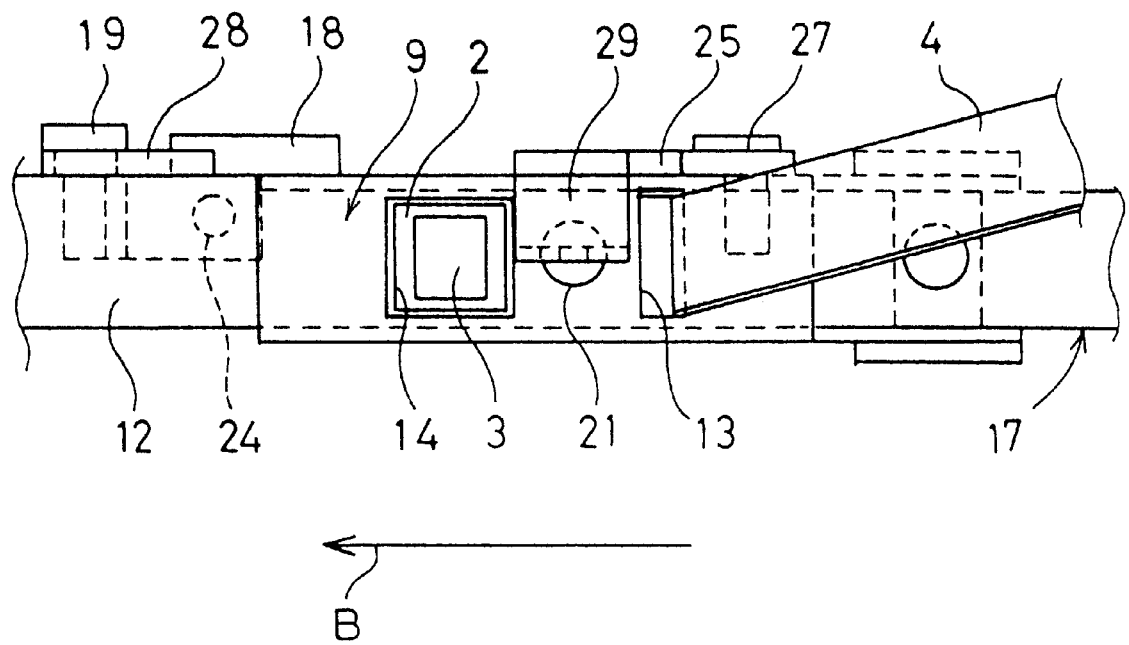
FIG. 4 is a plan view showing an electronic component feeder of a second embodiment.
Figure 5:
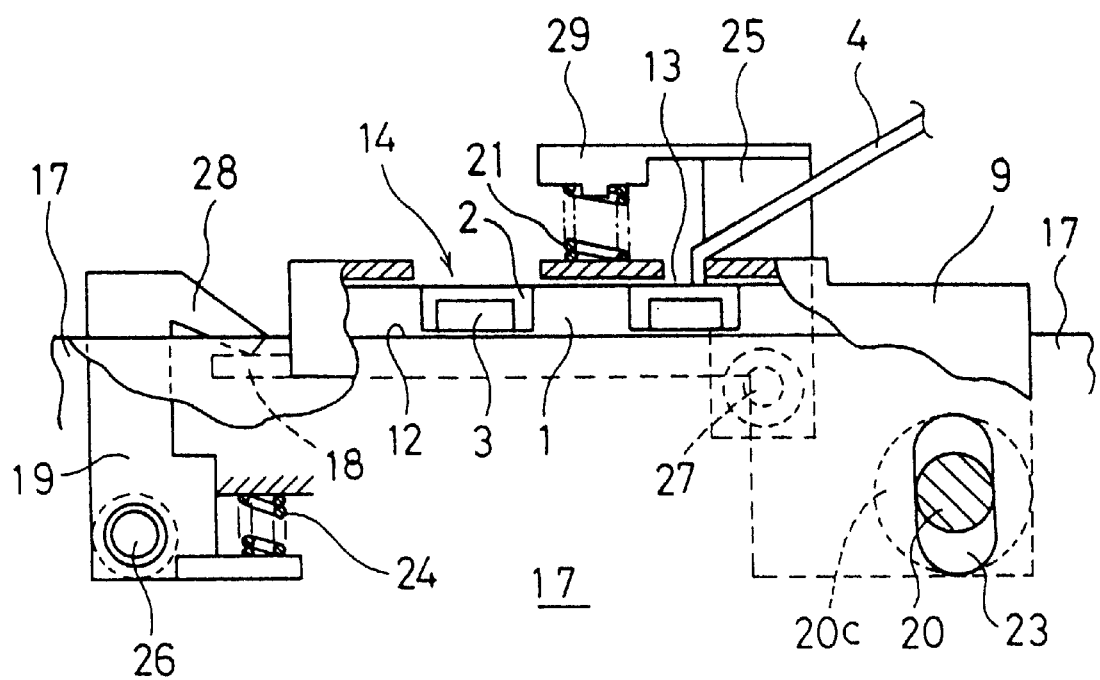
FIG. 5 is a cross-sectional view showing the essential parts of the electronic component feeder of the second embodiment.
Figure 6:
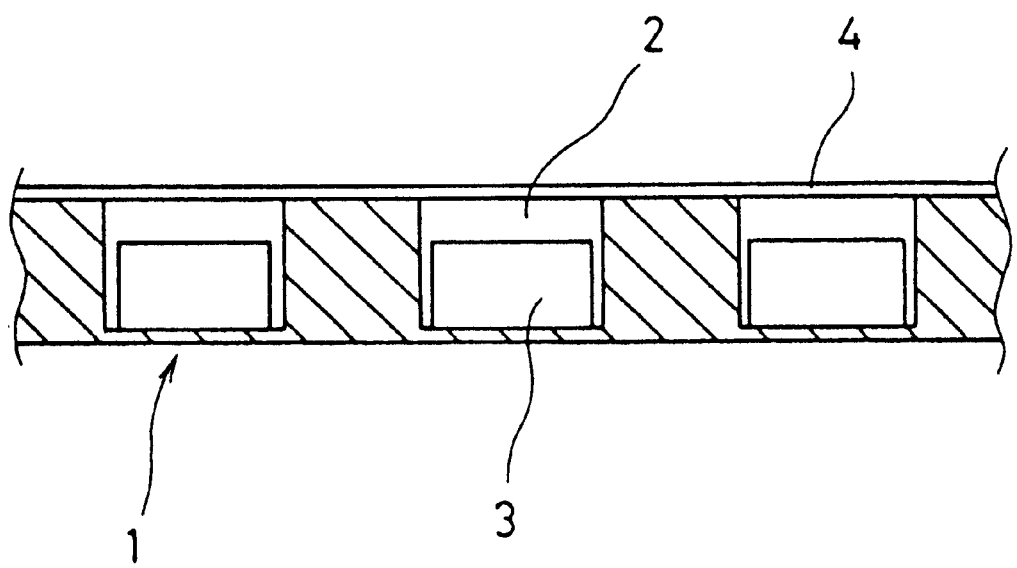
FIG. 6 is a cross-sectional view showing a carrier tape.
Figure 7:
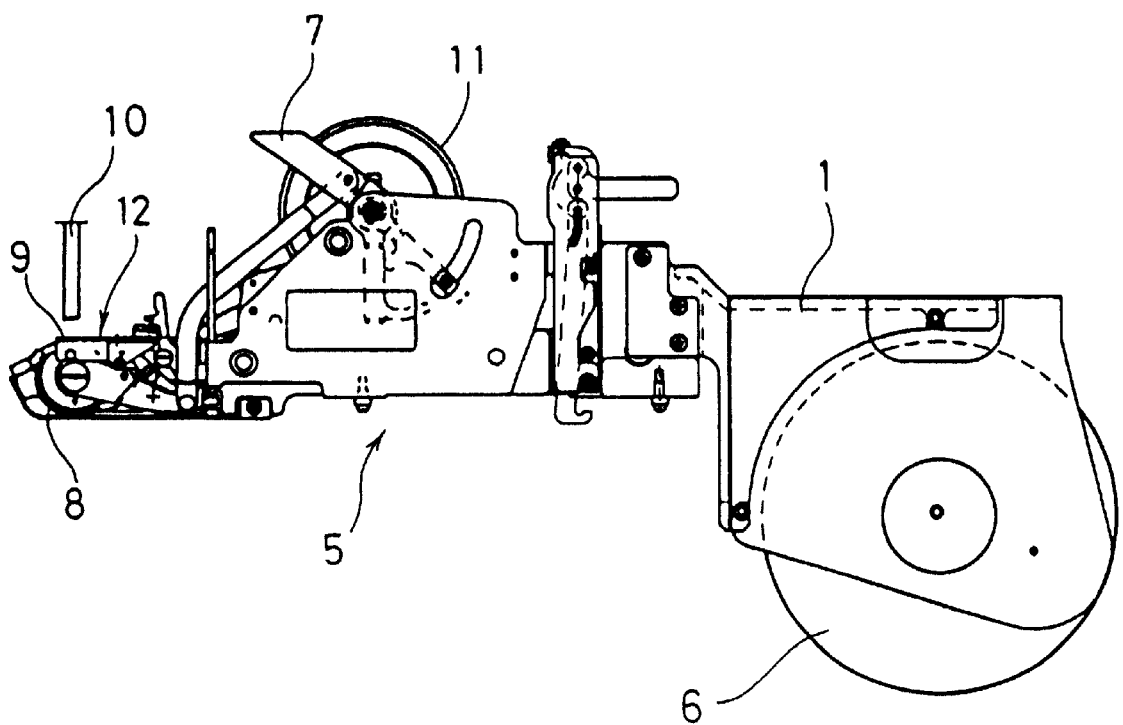
FIG. 7 is a front view showing an electronic component feeder of a prior art.
Figure 8:
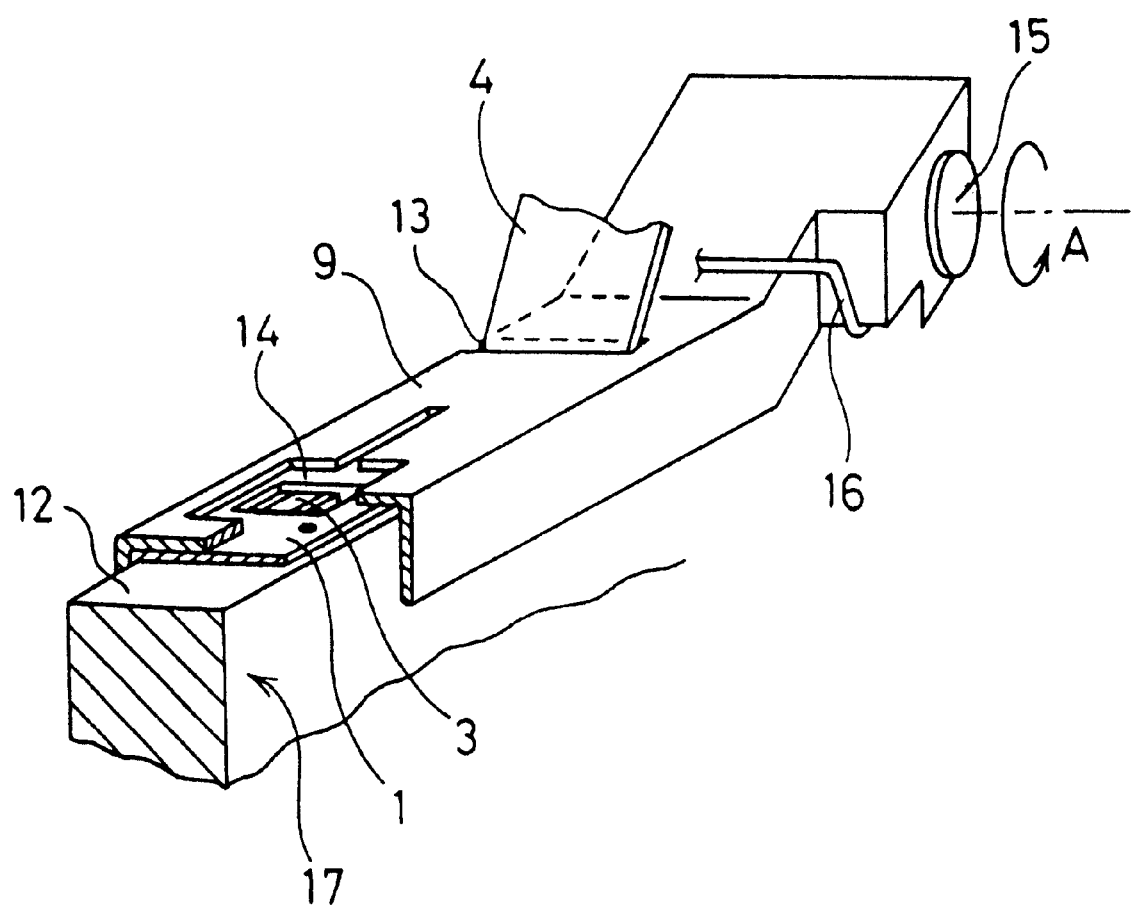
FIG. 8 is a perspective view, partly broken away, showing the essential parts of the electronic component feeder of the prior art.
Figure 9A:
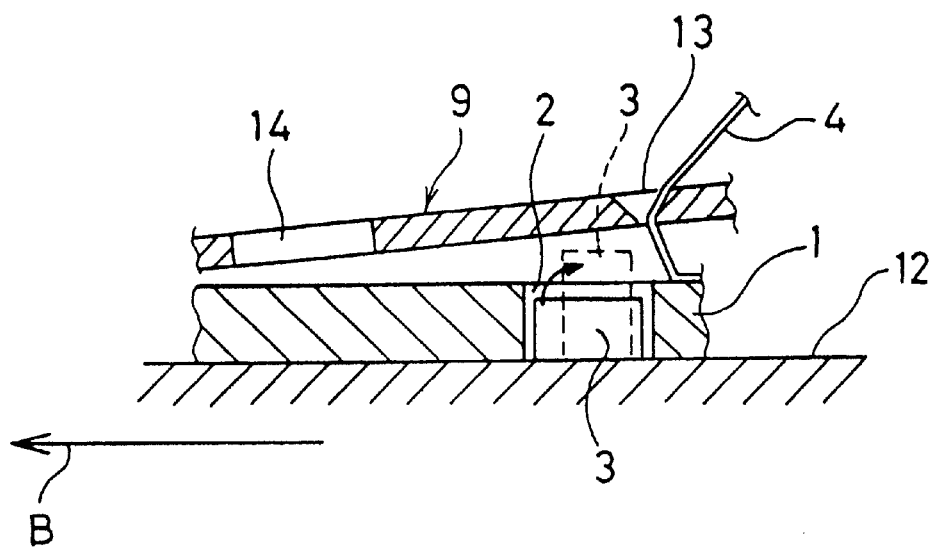
FIGS. 9(a) and 9(b) are views explaining the operation of an electronic component of the prior art, respectively, for the situation where a carrier tape is thin and the situation where the carrier tape is thick.
Figure 9B:
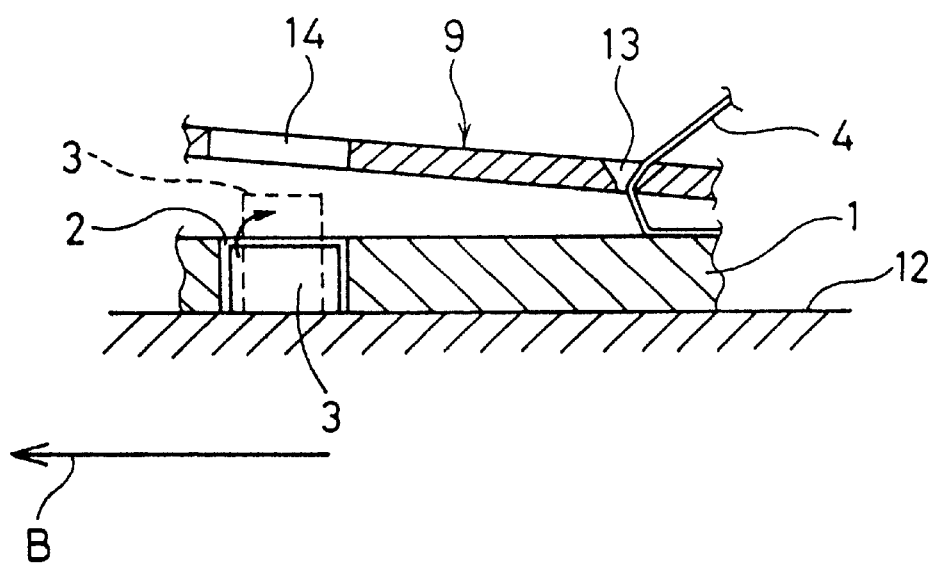

FIGS. 4 and 5 illustrate a second embodiment according to the present invention, wherein the same parts as those in the first embodiment are designated by the same reference numerals.

As shown in FIG. 4, the front end of a tape press body 9 is configured in the same manner as in the first embodiment. At the base end of the tape press body 9, a first compression spring 21 is interposed not between the upper end 17a of the inner circumference of a slot 23 and a small-diameter portion 20a of a pin 20, but between a front projection 29 of a bracket 25 fixed at one side surface of a tape transfer surface 12 of a main block 17 and the tape press body 9.

That is, as shown in FIG. 5, the second embodiment is identical to the first embodiment in the arrangement of the elevatable pin 20 which is disposed at the base end of the tape press body 9. However, in the second embodiment, the bracket 25 fixed via a fixing pin 27 is disposed at the one side surface in the vicinity of a peeling portion of the tape transfer surface 12, the front projection 29 of the bracket 25 projecting above the tape transfer surface 12, and the first compression spring 21 is interposed between the lower surface of the front projection 29 and the upper surface of the tape press body 9 so as to urge the tape press body 9 toward the tape transfer surface 12.

With this configuration, the tape press body 9 is slidably supported in the direction in which the carrier tape is pressed against the tape transfer surface according to the thickness of the carrier tape 1, and particularly, the distance between the tape press body and the tape transfer surface can be kept constant in the vicinity of the peeling portion. Consequently, it is possible to provide the electronic component feeder with a high supplying rate of the electronic component by eliminating vibration or rotation of the electronic component 3 and feeding deficiency of the tape.

Although in the above-described embodiments, the first and second compression springs are disposed each singly, they may be disposed in two or more to produce the same effects.

As described above, in the electronic component feeder according to the present invention, the tape press body slides with respect to the tape transfer surface according to the thickness of the carrier tape passing the tape press body so that the distance between the tape press body and the tape transfer surface can be uniformly kept constant over the long section, and further, the distance can be kept constant particularly in the vicinity of the peeling portion. As a result, it is possible to prevent any rotation of the electronic component at the time of the peeling of the top tape in the case where the carrier tape is thin or any vibration of the electronic component at the time of the extraction of the electronic component in the case where the carrier tape is thick. Furthermore, since no such strong urging force as to oppress the carrier tape is applied, it is possible to eliminate the feeding deficiency of the carrier tape due to excessive pressing of the carrier tape.

In this way, it is possible to provide the electronic component feeder with a high supplying rate of the electronic component by preventing any rotation or vibration of the electronic component and eliminating the transfer deficiency of the tape. Moreover, removal of any factors to cause the transfer deficiency of the electronic component can enhance a component suction rate, thereby shortening an interruption time due to the electronic component supplying deficiency in a circuit board packaging machine. As a result, high operability of a circuit board packaging machine can be achieved.

What is claimed is:

1. An electronic component feeder for extracting an electronic component from a container while peeling off a tape covering the top surface of a carrier tape for transferring the carrier tape along a tape transfer surface, comprising:

a tape press body abuttable against a fixed tape transfer surface via a carrier tape and including a peeling portion for peeling off a tape and a window for extracting an electronic component therethrough, said tape press body being slidably supported in a direction in which said carrier tape is pressed from above against said tape transfer surface; and urging means for urging said tape press body from above against portions of said fixed tape transfer surface adjacent front and rear thereof.

2. The electronic component feeder as set forth in claim 1, wherein:

a first end of said tape press body on an inlet side of said carrier tape is slidably supported in the direction in which said carrier tape is pressed against said tape transfer surface;

a second end of said tape press body on an outlet side of said carrier tape is in engagement with a pivotably supported turning body; and said urging mean comprises a first spring for urging said first end of said tape press body toward said tape transfer surface, and a second spring for urging said turning body in the direction in which said tape press body is pressed against said tape transfer surface.

3. The electronic component feeder as set forth in claim 2, wherein said first spring is interposed between the upper surface of said tape press body and a front end projection of a bracket fixed on a side surface of said tape transfer surface in the vicinity of said peeling portion of said carrier tape.

4. The electronic component feeder as set forth in claim 2, wherein said turning body is disposed in such a manner as to be in engagement with a projection extending outwardly of said tape transfer surface at a portion of said tape press body.

* * * * *